(12) United States Patent
Arata et al.

(10) Patent No.: US 9,000,853 B1
(45) Date of Patent: Apr. 7, 2015

(54) PACKAGED MEMS-BASED OSCILLATOR CIRCUITS THAT SUPPORT FREQUENCY MARGINING AND METHODS OF OPERATING SAME

(71) Applicant: Integrated Device Technology, Inc., San Jose, CA (US)

(72) Inventors: Nelson Arata, Sunnyvale, CA (US); Harmeet Bhugra, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 95 days.

(21) Appl. No.: 13/849,999

(22) Filed: Mar. 25, 2013

Related U.S. Application Data

(60) Provisional application No. 61/791,516, filed on Mar. 15, 2013.

(51) Int. Cl.
  *H03B 5/30* (2006.01)
  *H03L 7/16* (2006.01)
  *H03B 5/18* (2006.01)

(52) U.S. Cl.
  CPC ... *H03L 7/16* (2013.01); *H03B 5/30* (2013.01); *H03B 5/1852* (2013.01)

(58) Field of Classification Search
  CPC .................................................. H03B 5/1852
  USPC ................. 331/116 M, 156, 96; 327/156, 159
  See application file for complete search history.

(56) References Cited

U.S. PATENT DOCUMENTS

| 7,417,510 | B2 | 8/2008 | Huang |
| 7,532,081 | B2 | 5/2009 | Partridge et al. |
| 7,724,097 | B2 | 5/2010 | Carley et al. |
| 7,800,451 | B2 | 9/2010 | Fu et al. |
| 8,559,587 | B1 | 10/2013 | Buell et al. |
| 2012/0043999 | A1* | 2/2012 | Quevy et al. ................. 327/147 |

OTHER PUBLICATIONS

Pamarti et al., "A Spur Elimination Technique for Phase Interpolation-Based Fractional-N PLLs", IEEE Transactions on Circuits and Systems, Jul. 2008, vol. 55, No. 6, p. 1639-1647.
Zhang et al., "A Hybrid Spur Compensation Technique for Finite-Modulo Fractional-N Phase-Locked Loops", IEEE Journal of Solid-State Circuits, Nov. 2009, vol. 44, No. 11, p. 2922-2934.

(Continued)

*Primary Examiner* — Arnold Kinkead
(74) *Attorney, Agent, or Firm* — Myers, Bigel, et al.

(57) ABSTRACT

Integrated circuit devices include a packaged MEMS-based oscillator circuit, which is configured to support bidirectional frequency margining of a periodic output signal. This bidirectional frequency margining is achieved using a first signal to synchronize changes in a frequency of the periodic output signal and a second signal to control whether the changes in the frequency of the periodic output signal are incremental or decremental. In particular, the oscillator circuit may be configured so that each change in the frequency of the periodic output signal is synchronized to a corresponding first voltage transition of the first signal and a voltage level of the second signal may be used to control whether the changes in the frequency of the periodic output signal are incremental or decremental.

19 Claims, 5 Drawing Sheets

(56) References Cited

OTHER PUBLICATIONS

"FemtoClocks Crystal-to-LVPECL 350 MHz Frequency Margining Synthesizer", Integrated Device Technology, ICS843207-350, Dec. 3, 2007, 16 pages.

"Fractional/Integer-N PLL Basics", Technical Brief SWRA029, Texas Instruments, Wireless Communication Business Unit, Aug. 1999, 55 pages.

"Frequency Margining Using the Si534 Quad-Frequency Crystal Oscillator (XO)", Silicon Labs, AN272, © 2010 Silicon Laboratories, 2 pages.

"Crystal oscillators provide frequency margining", EE Times-Asia, Posted Date: May 7, 2008, Retrieved Date: Mar. 21, 2013, From URL: http://www.eetasia.com/ART_8800521087_499501_NP_d207d48b.HTM 2 pages.

* cited by examiner

PACKAGED MEMS-BASED OSCILLATOR CIRCUITS THAT SUPPORT FREQUENCY MARGINING AND METHODS OF OPERATING SAME

REFERENCE TO PRIORITY APPLICATION

The present application claims priority to U.S. Provisional Application Ser. No. 61/791,516, filed Mar. 15, 2013, the disclosure of which is hereby incorporated herein by reference.

FIELD OF THE INVENTION

The present invention relates to frequency synthesizer circuits and, more particularly, to MEMS-based frequency synthesizer circuits and methods of operating same.

BACKGROUND

Fractional-N frequency synthesizers can be used to overcome many limitations associated with integer-N frequency synthesizers. In fractional-N frequency synthesizers, the effective frequency divide ratio is a fractional number, which enables a relatively high frequency reference signal to be used to achieve fine resolution of frequencies in synthesizer output signals. This fractional number is typically achieved by periodically changing an integer divide ratio so that a desired fractional number can be approximated. One typical disadvantage associated with fractional-N frequency synthesis is the generation of unwanted low-frequency "spurs" by a dual-modulus (or multi-modulus) divider. These spurs make fractional-N frequency synthesizers impractical for many applications unless they are suppressed to a negligible level. Conventional spur reduction techniques include: (i) digital-to-analog (DAC) phase estimation, (ii) random jittering, which randomizes a divide ratio, (iii) sigma-delta ($\Sigma\Delta$) noise shaping, which modulates a divide ratio, (iv) phase interpolation; and (v) pulse generation. Some of these spur reduction techniques are disclosed in articles by: S. Pamarti et al., entitled "*A Spur Elimination Technique for Phase Interpolation-Based Fractional-N PLLs*", IEEE Trans. on Circuits and Systems, Vol. 55, No. 6, pp. 1639-1647, July (2008); and Li Zhang et al., entitled "*A Hybrid Spur Compensation Technique for Finite-Modulo Fractional-N Phase-Locked Loops*", IEEE Journal of Solid-State Circuits, Vol. 44, No. 11, pp. 2922-2934, November (2009).

As illustrated by FIG. 1A, a frequency synthesizer 10 may include a fractional-N divider 12 within a feedback path of a phase-locked loop (PLL), which filters jitter in the output of the divider 12. This fractional-N divider 12 may operate by modulating between two or more integer values. The phase-locked loop of FIG. 1A contains a phase detector 14, which receives an input reference signal (e.g., 25 MHz), a charge pump 16, a loop filter 18 and a voltage-controlled oscillator (VCO) 20. This VCO 20 generates an output signal having a frequency that is a non-integer multiple of the frequency of the input reference signal. An integer divider 22 may also be provided for generating an output signal at a reduced frequency relative to the VCO output signal. Examples of the frequency synthesizer 10 of FIG. 1A are disclosed at U.S. Pat. No. 7,532,081 to Partridge et al., entitled "*Frequency and/or Phase Compensated Microelectromechanical Oscillator*," and FIG. 3 of U.S. Pat. No. 7,417,510 to Huang, entitled "*Direct Digital Interpolative Synthesis*".

FIG. 1B illustrates a frequency synthesizer 10', which includes an integer divider 12' within a feedback path of a phase-locked loop (PLL). This phase-locked loop contains a phase detector 14, which receives an input reference signal (e.g., 25 MHz), a charge pump 16, a loop filter 18 and a voltage-controlled oscillator (VCO) 20, which generates an output signal having a frequency that is an integer multiple of the frequency of the input reference signal. Multiple fractional-N dividers 22a-22d may be provided for generating output signals having different frequencies, which do not have integer relationships with the output frequency of the VCO 20. As will be understood by those skilled in the art, additional circuitry may be needed to reduce jitter in the signals generated by the dividers 22a-22d. The dividers 22a-22d may be provided as interpolative dividers as disclosed at FIGS. 4-6 of the '510 patent to Huang. For example, as shown by FIG. 5 of Huang, an interpolative divider can include a fractional-N divider, which receives a VCO clock. A first order delta sigma modulator receives a digital divide ratio (M/N). The integer portion of the digital divide ratio is supplied to the fractional-N divider as a divide control signal, which can be a stream of integers that approximate the fractional divide ratio. A digital quantization error, which corresponds to the fractional portion of the divide ratio, is supplied to a digitally controlled phase interpolator. The jitter introduced by the fractional-N divider can be canceled by interpolation in the phase interpolator, which is based on the digital quantization error supplied by the delta sigma modulator. In this manner, the input clock from the VCO is first divided down by the fractional-N divider according to the control information provided by the delta sigma modulator and then the phase interpolator operates to cancel quantization errors in the output of the fractional-N divider. Additional examples of fractional-N frequency synthesizers, which utilize an accumulator within a numerically-controlled oscillator and a phase interpolator, are disclosed at FIG. 6 of the '510 patent to Huang and in U.S. Pat. No. 7,724,097 to Carley et al., entitled "*Direct Digital Synthesizer for Reference Frequency Generation*." Moreover, a fractional-N divider having divider modulation circuits therein with segmented accumulators is disclosed in commonly assigned U.S. application Ser. No. 13/425,761, filed Mar. 21, 2012, the disclosure of which is hereby incorporated herein by reference.

An additional frequency synthesizer that may utilize frequency margining techniques to generate a finely controllable clock is disclosed in U.S. Pat. No. 7,800,451 to Fu et al., entitled "*Frequency Adjustment for Clock Generator*." In addition, a low phase-noise frequency synthesizer with a frequency margining capability that supports output frequency variations of ±5% from nominal is disclosed in a publicly available datasheet from the assignee of the present application, entitled "*FemtoClocks Crystal-to-LVPECL 350 MHz Frequency Margining Synthesizer*," ICS843207-350 (2007).

SUMMARY OF THE INVENTION

Integrated circuit devices according to embodiments of the invention include a packaged MEMS-based oscillator circuit, which is configured to support bidirectional frequency margining of a periodic output signal. This bidirectional frequency margining is achieved using a first signal to synchronize changes in a frequency of the periodic output signal and a second signal to control whether the changes in the frequency of the periodic output signal are incremental or decremental. According to some of these embodiments of the invention, the oscillator circuit is configured so that each change in the frequency of the periodic output signal is synchronized to a corresponding first voltage transition of the first signal. The oscillator circuit may also be configured to use a voltage level of the second signal to control whether the changes in the frequency of the periodic output signal are incremental or decremental.

According to still further embodiments of the invention, the oscillator circuit is configured so that toggling of the second signal when the first signal is at a first voltage level operates to disable the periodic output signal. In particular, the oscillator circuit may be configured to enter a frequency margining mode of operation in sync with a second voltage transition of the second signal (e.g., low-to-high) when the first signal is at a second voltage level and further configured to exit the frequency margining mode of operation in response to the toggling of the second signal when the first signal is at a first voltage level (e.g., logic 0). The first and second voltage levels of the first signal may be opposite 0 and 1 logic states of the first signal.

According to still further embodiments of the invention, an integrated circuit device may include a packaged MEMS-based oscillator circuit configured to support bidirectional frequency margining of a periodic signal generated at an output thereof. This packaged MEMS-based oscillator circuit may be configured to use changes in a voltage of an output enable pin associated therewith to synchronize incremental and decremental changes in a frequency of the periodic signal during the frequency margining of the periodic signal. In particular, the packaged MEMSs-based oscillator circuit may be configured to use changes in first and second signals received at an output enable pin and a margining enable pin, respectively, to support the frequency margining of the periodic signal. According to further aspects of these embodiments of the invention, the packaged MEMS-based oscillator can be configured to use toggling of a voltage at a margining enable pin when the output enable pin is held at a first voltage level to terminate a frequency margining mode of operation and disable the periodic signal. Furthermore, in some of these embodiments of the invention, the packaged MEMS-based oscillator circuit can be configured to support a bidirectional frequency margining mode of operation that requires at least one decremental change in a frequency of the periodic signal prior to any incremental change in the frequency or vice versa.

DETAILED DESCRIPTION OF EMBODIMENTS

Figure 1A:
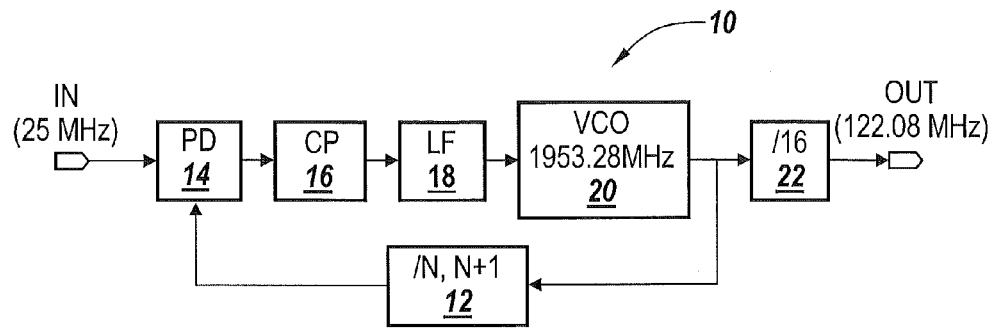
FIG. 1A is a block diagram of a frequency synthesizer that utilizes a fractional-N divider within a feedback path of a phase-locked loop (PLL), according to the prior art.
Figure 1B:
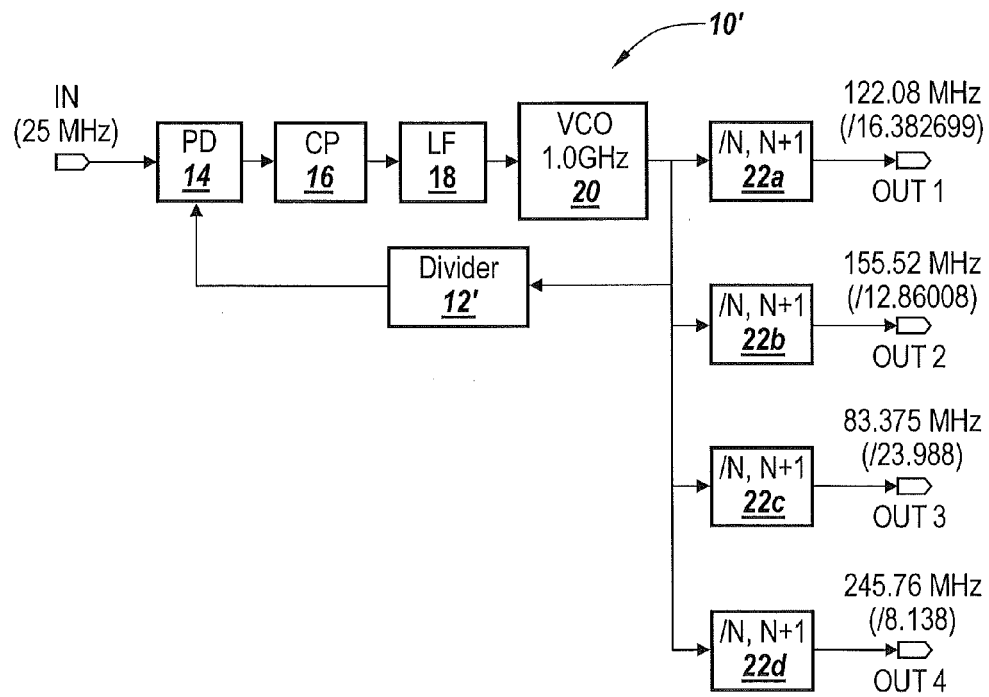
FIG. 1B illustrates a frequency synthesizer that utilizes an integer divider within a feedback path of a phase-locked loop (PLL), according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
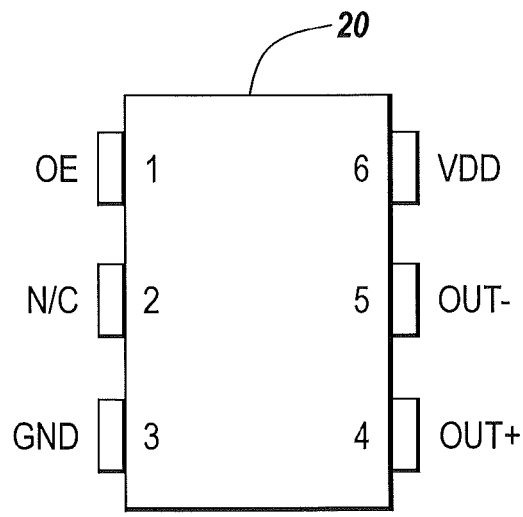
FIG. 2 is a diagram that illustrates a 6-pin layout of a packaged MEMS-based oscillator according to the prior art.
Figure 3A:
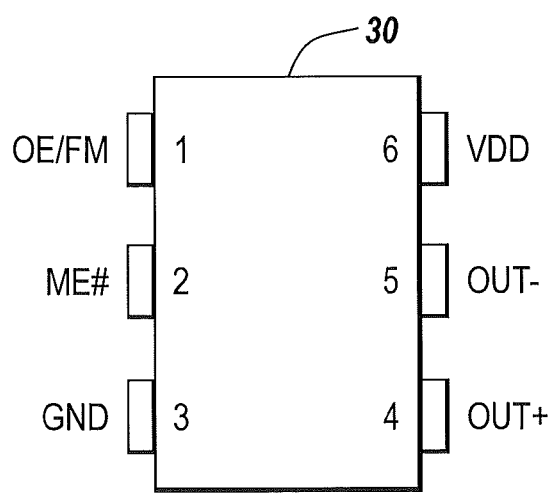
FIG. 3A is a diagram that illustrates a 6-pin layout of a packaged MEMS-based oscillator according to an embodiment of the present invention.

Referring now to FIG. 3A, a packaged MEMS-based oscillator circuit 30 according to an embodiment of the present invention is illustrated as including a dual-function output enable/frequency margining (OE/FM) pin (1) and an active low margining enable (ME#) pin (2), which distinguish it from the packaged MEMS-based oscillator circuit 20 of FIG. 2. As shown by FIG. 2, a conventional package of a MEMS-based oscillator circuit 20 may include six pins. These six pins may be identified as an output enable (OE) pin (1), an inactive "no-connect" (N/C) pin (2), a ground (GND) pin (3), a power supply (VDD) pin, and a pair of differential periodic output signal (OUT+ and OUT−) pins (4, 5). Thus, as shown by FIGS. 2 and 3A, bidirectional frequency margining may be advantageously achieved without requiring additional pins, which supports backward compatibility to existing 6-pin footprints. Moreover, as described more fully hereinbelow, the inclusion of a dual-function OE/FM pin with a margining enable pin (ME#) supports increases and decreases in a frequency of the output signal in real time (i.e., not limited to pre-programmed frequencies) with a high granularity (e.g., 0.4 ppm) without rebooting, which enables the MEMS-based oscillator circuit 30 to operate as a digital "VCXO".

Figure 3B:
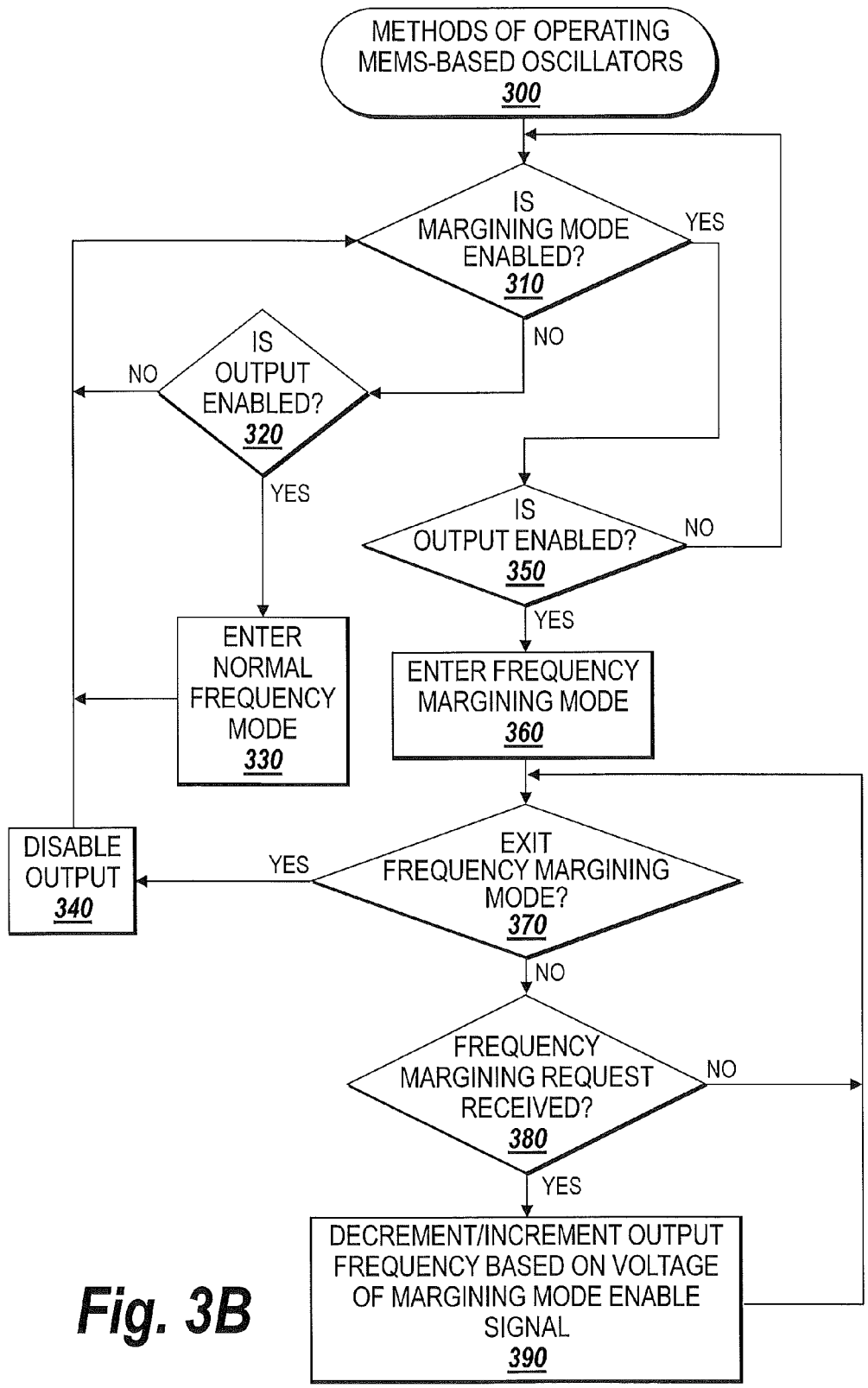
FIG. 3B is a flow diagram that illustrates operations of the MEMS-based oscillator of FIG. 3A, according to an embodiment of the present invention.

As illustrated by the flow diagram of FIG. 3B, the dual-function output enable/frequency margining (OE/FM) pin (1) and the active-low margining enable (ME#) pin (2) support methods of operating MEMS-based oscillators 300. These methods include a check, Block 310, to determine whether a margining mode has been enabled. If not, a check is made to confirm whether the periodic output signals (OUT+/OUT−) have been enabled, Block 320. If yes, a normal frequency mode of operation, Block 330, is entered.

However, if the margining mode has been enabled, a check is made at Block 350 to determine whether the output is enabled. If so, the frequency margining mode can be entered, Block 360. As shown by Block 370, an exit from the frequency margining mode may result in a disablement of the periodic output signal, Block 340 and a return to the decision Block 310. However, in the absence of any termination of the frequency margining mode, a check is made to determine whether an active frequency margining request has been received, Block 380. If so, the frequency of the periodic output signal (OUT+, OUT−) is decremented/incremented, Block 390. As shown, decrement or increment of the frequency of the periodic output signal may be a function of the voltage (e.g., low or high) of the margining mode enable signal (ME#).

Figure 3C:
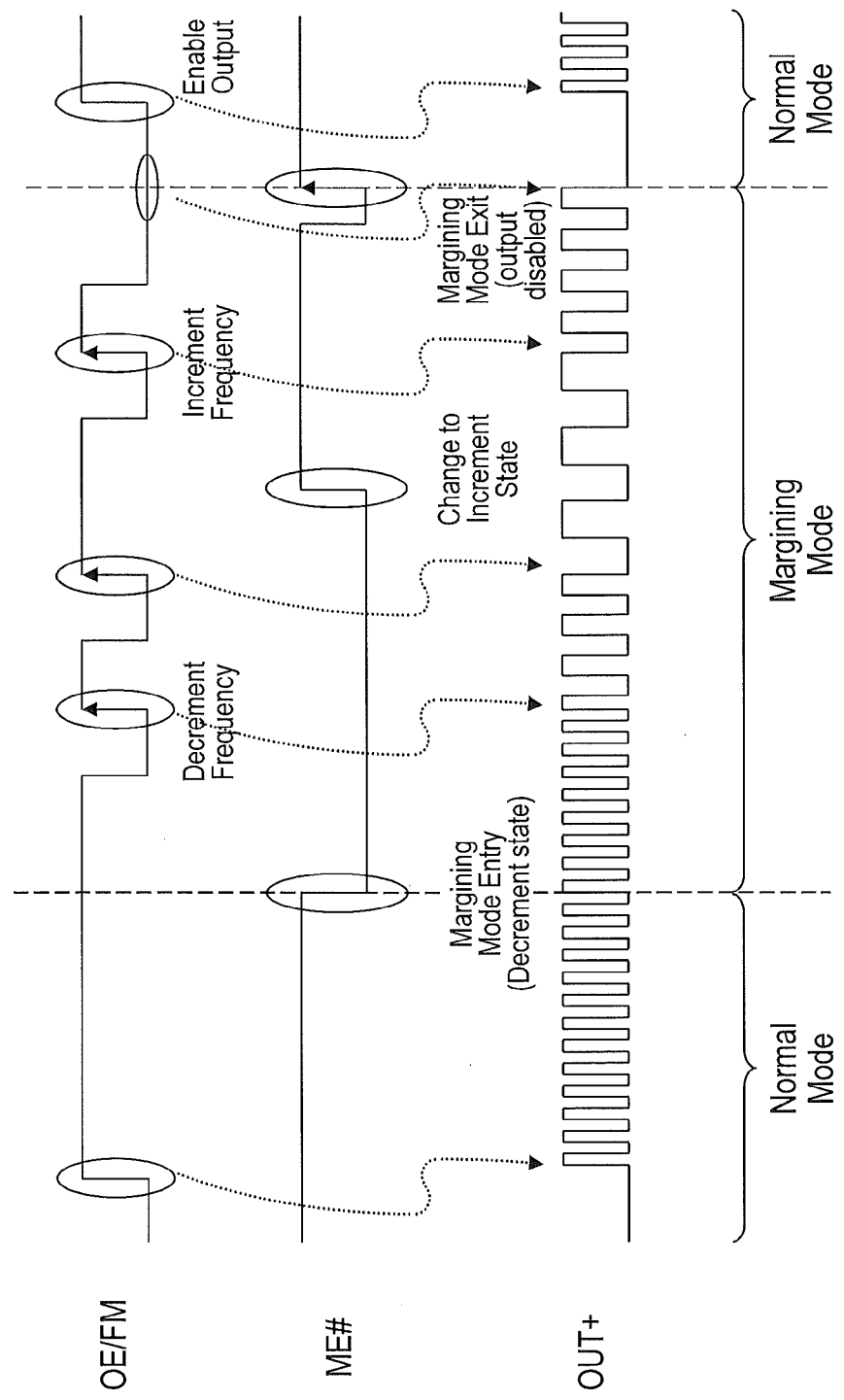
FIG. 3C is a timing diagram that illustrates operations of the MEMS-based oscillator of FIGS. 3A-3B, according to an embodiment of the present invention.
Figure 4:
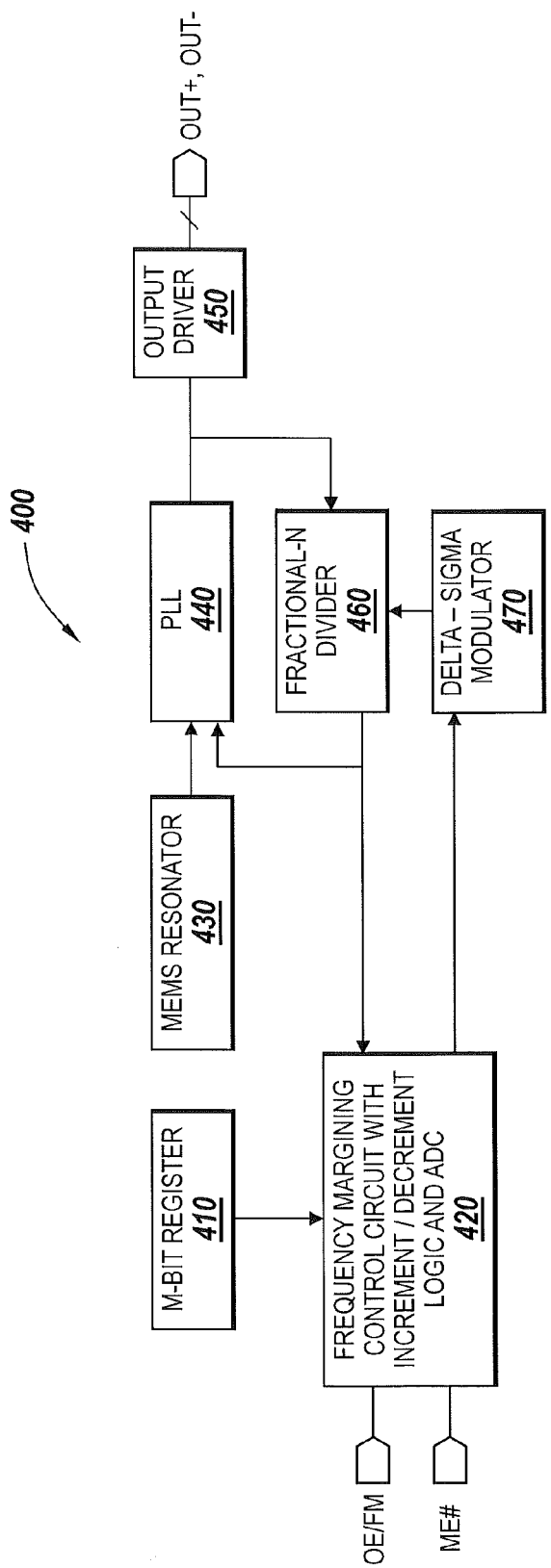
FIG. 4 is a block diagram of an embodiment of the MEMS-based oscillator of FIG. 3A.

In particular, as shown by the timing diagram of FIG. 3C, the packaged MEMS-based oscillator circuits 30 and 400 of FIGS. 3A and 4 may commence generation of a periodic output signal (e.g., OUT+) at a predetermined frequency in sync with a rising edge of the output enable signal (OE), subject to the condition that the active-low margining mode enable signal (ME#) is inactive (e.g., logic 1). As further illustrated by FIG. 3C, once initiated, the generation of the periodic output signal (OUT+) at the predetermined frequency continues even after entry into the margining mode of operation has been enabled by the high-to-low (e.g., 1→0) transition of the margining mode enable signal ME#. Accordingly, an immediate return of the margining mode enable signal ME# to an inactive voltage level (e.g., logic 1) can occur without any change in frequency of the periodic output signal (OUT+).

Nonetheless, each toggle (i.e., high-to-low/low-to-high transition sequence) of the dual-function output enable/frequency margining (OE/FM) pin (1) while the margining enable signal ME# remains at an enabled voltage level (e.g., logic 0) will sync changes in a frequency of the periodic output signal (OUT+). For example, as shown by FIG. 3C, a first toggle of the OE/FM pin will cause an initial decrement in the frequency of the periodic output signal (OUT+), but subsequent toggling of the OE/FM pin will cause decrements or increments in the frequency of the periodic output signal (OUT+) that are based on a voltage level of ME# (low ME#=decrement, high ME#=increment). Alternatively, the packaged MEMS-based oscillator circuits 30 and 400 of FIGS. 3A and 4 may be configured so that a first toggle of the OE/FM pin will cause an initial increment in the frequency of the periodic output signal (OUT+), but subsequent toggling of the OE/FM pin will cause decrements or increments in the frequency of the periodic output signal (OUT+) that are based on a voltage level of ME# (low ME#=decrement, high ME#=increment).

Finally, as illustrated by the right side of FIG. 3C, termination of the margining mode of operation can be achieved when the margining mode enable signal ME# undergoes a low-to-high transition while the dual-function output enable/frequency margining (OE/FM) pin is held at a "disabled" voltage level (e.g., logic 0). When this occurs, the periodic output signal (OUT+) is disabled and remains disabled until the dual-function output enable/frequency margining (OE/FM) pin returns to an "enabled" voltage level (e.g., logic 1). The predetermined output frequency of the periodic output signal (OUT+) is then reestablished in sync with the transition (e.g., low-to-high) of the output enable/frequency margining (OE/FM) signal.

FIG. 4 illustrates a MEMS-based oscillator circuit 400 that performs the operations of FIGS. 3B-3C and may be embodied within a packaged device, as shown by FIG. 3A. As shown, the oscillator circuit 400 utilizes a phase-locked loop (PLL) 440 to generate the periodic output signals (OUT+, OUT−) via an output driver 450, in response to: (i) a periodic reference signal generated by a MEMS resonator 430 and (ii) a feedback signal generated by a fractional-N divider 460, which is controllable by a signal generated by a delta-sigma modulator 470. An M-bit register 410 (e.g., non-volatile memory) is provided with a preset binary value therein that specifies the value of the predetermined frequency of the periodic output signals. Moreover, a control circuit 420 is provided, which is responsive to the dual-function output enable/frequency margining (OE/FM) signal and the active-low margining enable (ME#) signal. This control circuit 420, which may contain increment/decrement logic and an analog-to-digital converter (ADC), operates to control a value of a signal provided to the delta-sigma modulator 470, which can be varied (up/down) to achieve a desired output frequency in real time by influencing the value of the division performed by the divider 460.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
a packaged MEMS-based oscillator circuit configured to support bidirectional frequency margining of a periodic output signal at an output thereof by using a first signal received at a first dual-function input pin thereof to perform a dual-function of (i) disabling/enabling the periodic output signal at the output during a normal mode of operation and (ii) synchronizing changes in a frequency of the periodic output signal during a frequency margining mode of operation; and a second signal received at a second dual-function input pin thereof to: synchronize timing of a transition from the normal mode of operation to the margining mode of operation and, in addition, control whether the changes in the frequency of the periodic output signal during the frequency margining mode of operation are incremental or decremental.

2. The device of claim 1, wherein said oscillator circuit is configured so that each change in the frequency of the periodic output signal during the frequency margining mode of operation is synchronized to a corresponding first voltage transition of the first signal.

3. The device of claim 2, wherein said oscillator circuit is configured to use a voltage level of the second signal to control whether the changes in the frequency of the periodic output signal during the frequency mode of operation are incremental or decremental.

4. The device of claim 3, wherein said oscillator circuit is configured so that toggling of the second signal when the first signal is at a first voltage level operates to terminate the frequency mode of operation and disable the periodic output signal.

5. The device of claim 3, wherein said oscillator circuit is configured to enter the frequency margining mode of operation in sync with a second voltage transition of the second signal when the first signal is at a second voltage level and further configured to exit the frequency margining mode of operation in response to a toggling of the second signal when the first signal is at a first voltage level.

6. The device of claim 5, wherein the first and second voltage levels of the first signal are opposite logic states of the first signal.

7. An integrated circuit device, comprising:
a packaged MEMS-based oscillator circuit configured to support bidirectional frequency margining of a periodic signal generated at an output thereof and further configured to use changes in a voltage of a dual-function output enable/frequency margining (OE/FM) pin associated therewith to: (i) synchronize corresponding incremental and decremental changes in a frequency of the periodic signal at the output during the frequency margining of the periodic signal and (ii) enable/disable the periodic signal at the output during a normal mode of operation.

8. An integrated circuit device, comprising:
a packaged oscillator circuit configured to support bidirectional frequency margining of a periodic signal generated at an output thereof and further configured to use changes in first and second signals received at a dual-function output enable/frequency margining (OE/FM) pin and a margining enable pin, respectively, to support the frequency margining of the periodic signal at the output during a frequency margining mode of operation; and, alternatively, an enabling/disabling of the periodic signal during a normal mode operation when the frequency margining is disabled.

9. The device of claim 8, wherein said packaged MEMS-based oscillator is configured to use toggling of a voltage at the margining enable pin when the dual-function OE/FM pin is held at a first voltage level to terminate a frequency margining mode of operation.

10. The device of claim 8, wherein said packaged MEMS-based oscillator is configured to use toggling of a voltage at the margining enable pin when the dual-function OE/FM pin is held at a first voltage level to terminate a frequency margining mode of operation and simultaneously disable the periodic signal at the output.

11. The device of claim 8, wherein said packaged MEMS-based oscillator circuit is configured to support a bidirectional frequency margining mode of operation that requires at least one decremental change in a frequency of the periodic signal prior to any incremental change in the frequency or vice versa.

12. An integrated circuit device, comprising:
a packaged oscillator circuit configured to support bidirectional frequency margining of a periodic output signal, which during a frequency margining mode of operation undergoes at least one stepwise change in frequency that is synchronized with a low-to-high or high-to-low transition of a dual-function output enable/frequency margining (OE/FM) signal received at a first input pin, said packaged oscillator circuit further configured to transition from the margining mode of operation to a normal mode of operation in-sync with a toggling of a margining enable signal received at a second input pin while the OE/FM signal is held at a first logic level.

13. The device of claim 12, wherein the transition causes the periodic output signal to become disabled.

14. The device of claim 1, wherein the bidirectional frequency margining during the frequency margining mode of operation requires at least one decremental change in a frequency of the periodic output signal prior to any incremental change in the frequency or vice versa.

15. The device of claim 1, wherein the MEMS-based oscillator circuit is disposed in a package having only six pins.

16. The device of claim 7, wherein the MEMS-based oscillator circuit is disposed in a package having only six pins.

17. The device of claim 8, wherein the oscillator circuit is disposed in a package having only six pins.

18. The device of claim 12, wherein the oscillator circuit is disposed in a package having only six pins.

19. The device of claim 1, wherein during the frequency margining mode of operation, a single stepwise increase (decrease) in a frequency of the periodic output signal relative to the frequency of the periodic output signal during the normal mode of operation requires at least one stepwise decrease (increase) in the frequency followed by two or more stepwise increases (decreases) in the frequency.

* * * * *